United States Patent [19]

Korsunsky et al.

[11] Patent Number: 5,383,095
[45] Date of Patent: Jan. 17, 1995

[54] CIRCUIT BOARD AND EDGE-MOUNTABLE CONNECTOR THEREFOR, AND METHOD OF PREPARING A CIRCUIT BOARD EDGE

[75] Inventors: Iosif Korsunsky, Harrisburg; Dimitry G. Grabbe, Middletown; Robert C. Klotz, Harrisburg, all of Pa.

[73] Assignee: The Whitaker Corporation, Wilmington, Del.

[21] Appl. No.: 145,017

[22] Filed: Oct. 29, 1993

[51] Int. Cl.⁶ ............... H01R 23/68; H01R 29/00; H05K 3/30
[52] U.S. Cl. .................. 361/785; 29/835; 29/837; 29/845; 439/53; 439/59; 439/62; 439/65; 174/261; 174/266; 361/769; 361/787
[58] Field of Search ............ 174/250, 256, 257, 258, 174/259–263, 266; 439/43–44, 45–48, 50, 49, 51–53, 59, 62, 65; 361/751, 757, 760, 761, 767, 769, 785, 787; 29/837, 835, 843–845, 854

[56] References Cited

U.S. PATENT DOCUMENTS

| | | |
|---|---|---|
| 3,281,627 | 10/1966 | Fetterolf et al. ............... 317/101 |
| 3,357,099 | 12/1967 | Nagy et al. . |
| 3,357,856 | 12/1967 | Ragan et al. . |
| 3,964,087 | 6/1976 | Mallon . |
| 4,223,968 | 9/1980 | Kawabata et al. . |
| 4,526,429 | 7/1985 | Kirkman . |
| 4,616,893 | 10/1986 | Feldman . |
| 4,621,880 | 11/1986 | Rush . |
| 4,710,133 | 12/1987 | Lindeman ..................... 439/92 |
| 4,762,500 | 8/1988 | Dola et al. ..................... 439/79 |
| 4,836,806 | 6/1989 | Dougherty et al. ............ 439/751 |
| 4,907,979 | 3/1990 | Feldman ....................... 439/83 |
| 4,935,284 | 6/1990 | Puerner ......................... 428/137 |
| 5,040,999 | 8/1991 | Collier ......................... 439/108 |
| 5,127,839 | 7/1992 | Korsunsky et al. ............ 439/79 |
| 5,199,885 | 4/1993 | Korsunsky et al. ............ 439/79 |

FOREIGN PATENT DOCUMENTS

| | | |
|---|---|---|
| 254385 | 1/1988 | European Pat. Off. . |
| G8908718.6 | 11/1989 | Germany . |
| 1060271 | 3/1967 | United Kingdom ............ 439/823 |
| 2222917 | 3/1990 | United Kingdom . |
| 2248345 | 4/1992 | United Kingdom . |

Primary Examiner—Bot Ledynh
Attorney, Agent, or Firm—Anton P. Ness

[57] ABSTRACT

A circuit board (12) and electrical connector (10) mounted to an edge (18) thereof is disclosed. The circuit board (12) includes an edge (18) and two major surfaces (14, 16) extending therefrom having circuitry (20). Plated through holes (24) are arranged adjacent the edge and are interconnected to circuitry on the circuit board. Each plated through hole (24) is associated with an opening such as a slot (26) or partial slot (27) that is formed in the edge (18) of the board so that it intersects the hole. The posts (32) of the connector (10) extend into the openings (26, 27) preferably in interference fit therewith whereafter soldering completes the electrical connections of the posts to the through holes.

23 Claims, 6 Drawing Sheets

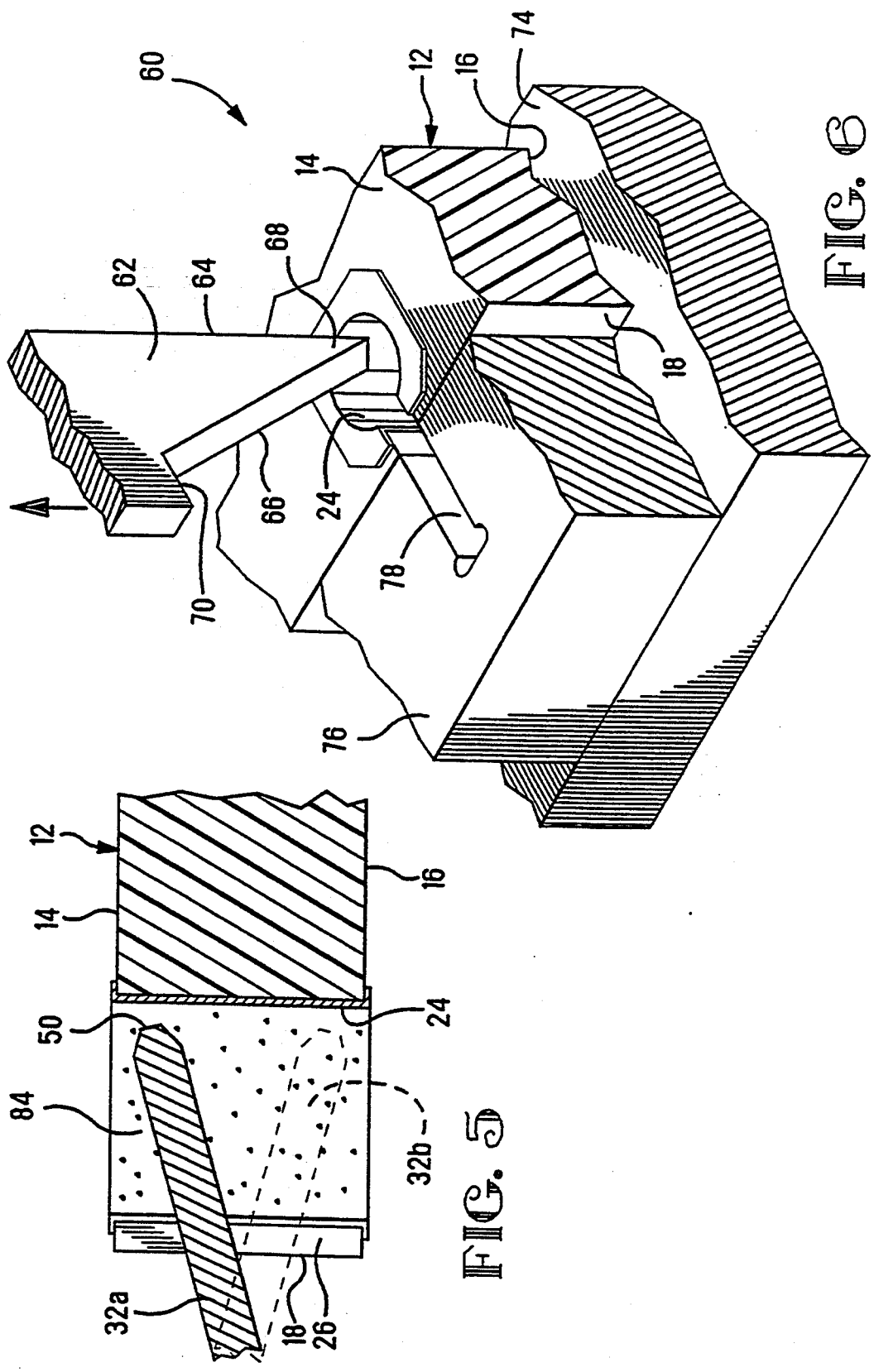

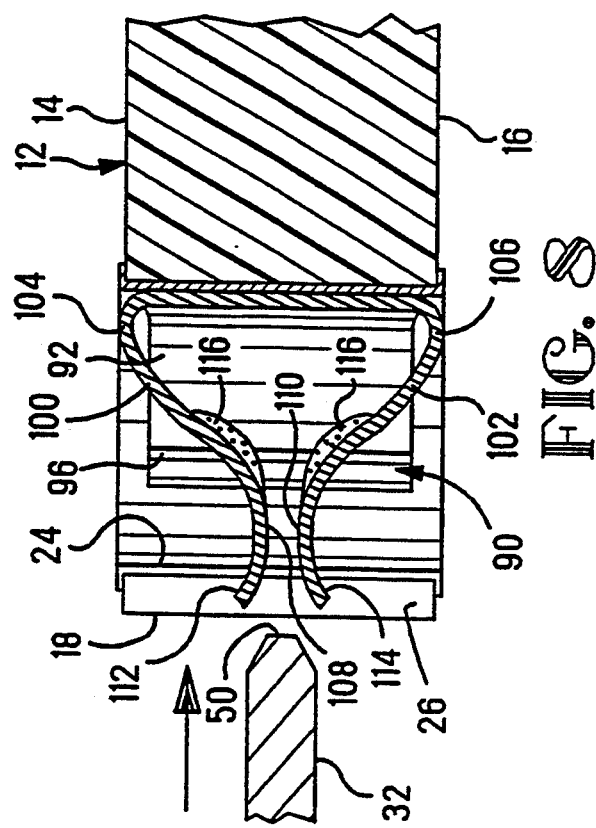
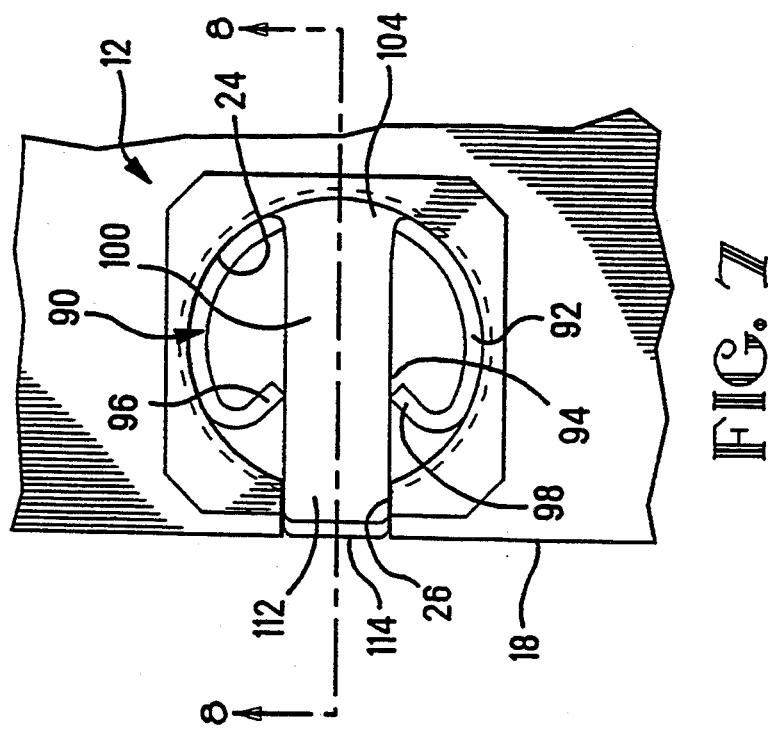

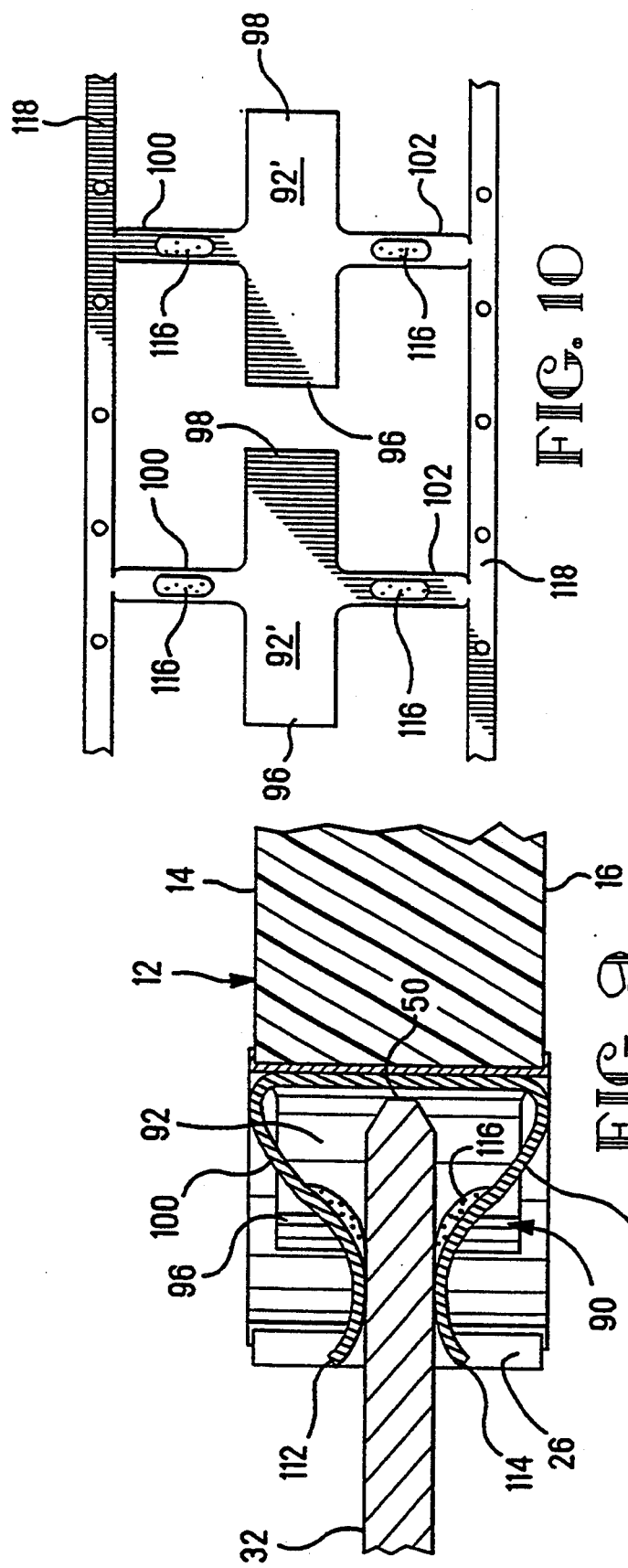

CIRCUIT BOARD AND EDGE-MOUNTABLE CONNECTOR THEREFOR, AND METHOD OF PREPARING A CIRCUIT BOARD EDGE

FIELD OF THE INVENTION

The present invention relates to a circuit board and an electrical connector mountable to an edge thereof and more particularly to means for interconnecting ground circuitry on the circuit board with ground posts on the connector.

BACKGROUND OF THE INVENTION

In certain high density circuit board applications such as board to board interconnections one of the mating connectors is attached to the edge of one of the boards and the other connector is either attached to the edge or the surface of the other board. Such connectors, when mounted to the edge of the board, occupy less board space than their surface mount counterparts, and therefore are more desirable in these applications. Examples of these types of connectors are disclosed in U.S. Pat. Nos. 5,199,885 and 5,127,839 which issued to Korsunsky et al. on Apr. 6, 1993 and Jul. 7, 1992 respectively. In such edge mounted connectors, the signal contacts generally have solder tails that extend outwardly in two parallel rows, one row of tails being in contact with pads on one side of the circuit board and the tails in the other row being in contact with pads on the opposite sides of the circuit board. The ground contacts are positioned so that their posts extend outwardly in a row between and parallel with the two rows of signal contact solder tails. The ground posts extend into holes in the edge of the circuit board and engage transversely arranged plated through holes that are interconnected with ground circuitry on the circuit board. Solder paste in the plated through holes and on the contact pads is reflowed, to effect soldered connections between the posts and solder tails and their respective holes and pads.

As the circuitry on these circuit boards becomes more dense the edge mounted connector must become correspondingly smaller resulting in very delicate contacts. Any variation in alignment during assembly of the connector to the circuit board may cause the contacts to become imaged. Therefore, precise alignment is necessary. This requires that the holes in the edge of the circuit board be very precisely located between the two major surfaces. It is known to drill or to pierce or punch these holes from the edge of the board inwardly toward and through the wall of the plated through hole. This tends to cause portions of the insulating circuit board to enter the plated through hole and to interfere with the subsequent soldering process, and such debris must be cleaned out prior to soldering. Additionally, these holes are only about 0.018 inch square making the punch tooling fragile and easily damaged. As a result, these openings are difficult and extensive to make properly accurately located and dimensioned. What is needed is a way of interconnecting the posts to the edge-mounted connector with the plated through holes of the circuit board without the need of forming holes into the edge of the board.

SUMMARY OF THE INVENTION

A circuit board is arranged to receive an electrical connector mounted to an edge thereof. The present invention comprises defining openings along the edge which extend from the edge surface inwardly to intersect the plated through holes, and which extend from one major surface toward the other major surface or which are slots extending completely to the other major surface. Posts of a connector are insertable through the openings and are electrically connected to the plated through hole spaced inwardly from the edge surface. The connector posts may be ground posts of bus bars, or may be posts of signal contacts or power contacts of the connector or even posts of a shield member surrounding the connector. The connector may have one such post in addition to other contacts of conventional design, with the one post insertable into one slot in the board edge, such as for shielding or power.

In one specific embodiment, the connector includes signal contacts having solder tails adapted to be interconnected to circuitry on the circuit board and ground contacts having posts adapted to be interconnected to ground circuitry on the circuit board. The circuit board has an edge and two opposite major surfaces extending from the edge, electrically conductive contact pads on at least one of the surfaces in electrical engagement with circuitry on the circuit board, and a plurality of plated through holes adjacent the edge, substantially perpendicular to the major surfaces and in electrical engagement with ground circuitry on the circuit board. A plurality of slots are formed in the edge of the circuit board extending from one of the two major surfaces toward or to the other major surface, wherein each slot intersects a respective one of the holes. Each of the slots is adapted to receive a respective one of the posts so that the axes of the posts are generally parallel with and between the two major surfaces and in electrical engagement with respective plated through holes, such as through soldering. Alternatively, the posts may extend into the respective slots angled slightly upwardly and downwardly alternating along the row of solder tails, thus when soldered, altogether defining an improved mechanical retention to the board edge. Also the posts may have ends which are all angled slightly in one direction.

In another embodiment a conductive insert is secured within each plated through hole and which includes portions gripping a post inserted through the slot and into the plated through hole, while a pair of spring arms establishes an electrical connection therewith. Afterward soldering of the post to the insert may be performed to complete the electrical and mechanical connection.

Embodiments of the present invention will now be described by way of example with reference to the accompanying drawings.

DESCRIPTION OF THE FIGURES

FIG. 5 is a cross-sectional view similar to FIG. 3 in which alternating ground solder tails are angled upwardly and downwardly in the slots and through holes;

FIG. 6 is an isometric view of a portion of the circuit board shown in FIG. 1, positioned in a tool for shearing the slots in accordance with the present invention;

FIGS. 7 and 8 are plan and cross-sectional views of one of the plated through holes shown in FIG. 1 having an insert therein, with FIG. 8 being taken along lines 8—8 in FIG. 7 prior to insertion of the post;

FIG. 9 is a view similar to that of FIG. 8 showing the post fully inserted; and

FIG. 10 is a flat pattern view of the insert shown in FIG. 7 after stamping but with the carrier strips attached.

DESCRIPTION OF THE PREFERRED EMBODIMENTS

Figure 1:
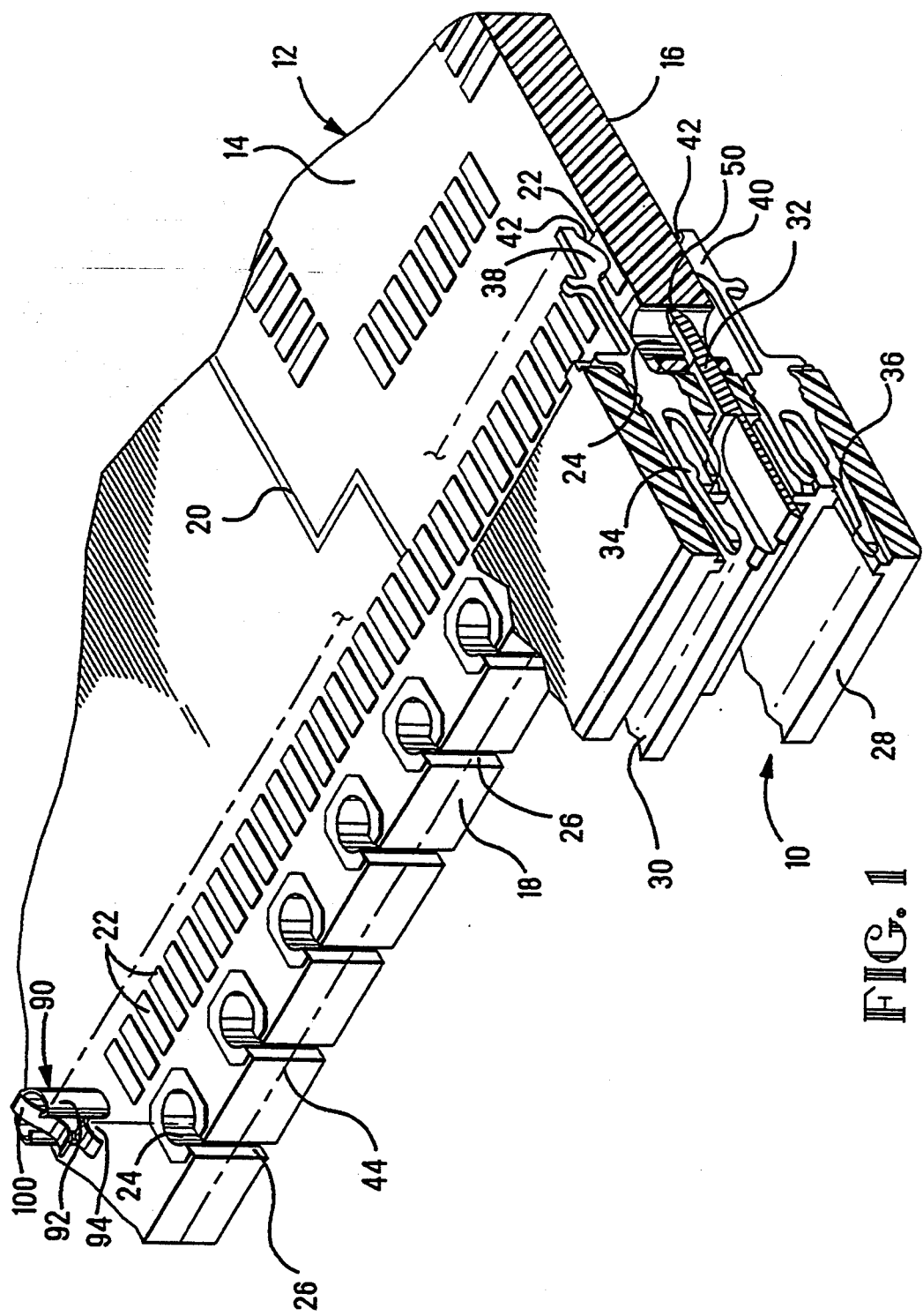
FIG. 1 is an isometric view of a portion of a circuit board and connector assembly incorporating the teachings of the present invention.
Figure 3:
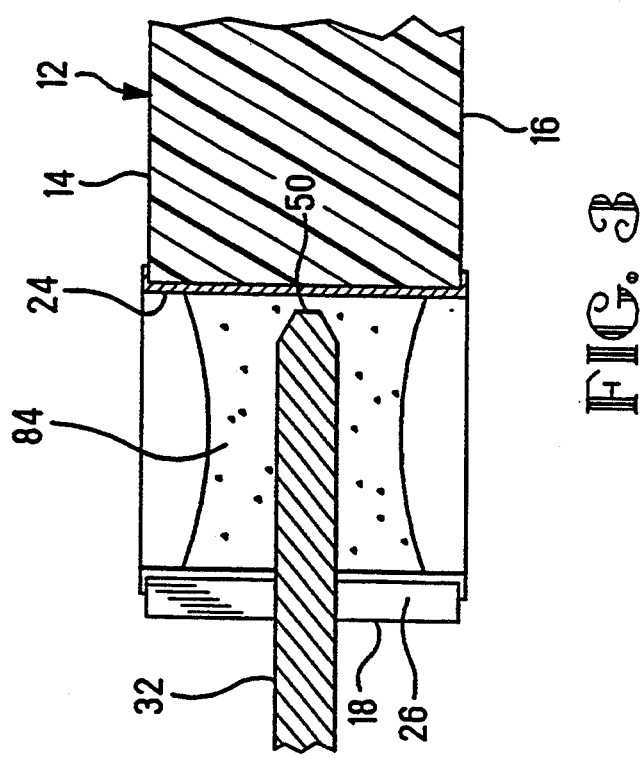
FIGS. 2 and 3 are plan and cross-sectional views of one of the plate through holes shown in FIG. 1, with FIG. 3 being taken along lines 3—3 of FIG. 2.
Figure 2:
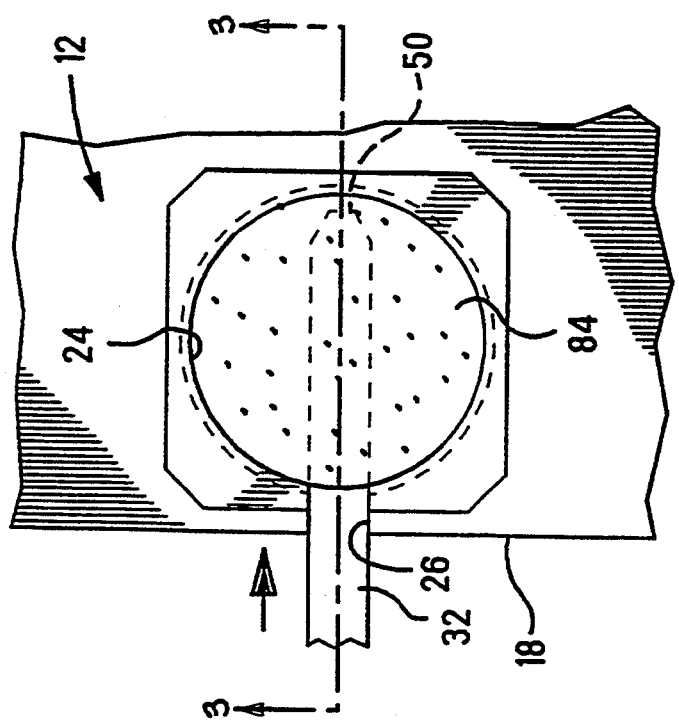

There is shown in FIG. 1 a portion of an edge mounted electrical connector 10 and a circuit board 12 to which the connector is attached. The circuit board 12 has two opposite substantially parallel major surfaces 14 and 16 which extend from an edge 18. Metalized circuitry 20 is arranged on each of the major surfaces and terminates in any one of several contact pads 22 that are arranged on the two surfaces, or any one of several plated through holes 24. The plated through holes 24, in this example, are connected to ground circuitry on the circuit board with centers thereof spaced inwardly from the edge surface a distance greater than the radius of the holes so that dielectric material of the circuit board remains between the plated through holes and the edge surface. A plurality of board openings such as holes 26 are formed in the edge 18 so that one slot is in alignment with and intersecting each respective plated through hole 24, and having dimensions less wide than the diameters of the holes. The connector 10 includes a housing 28 having a ground bus 30 extending along its longitudinal center with posts 32 projecting from the housing, through respective slots 26, and into respective plated through holes 24, with axes thereof generally perpendicular to the edge surface and generally parallel to the major surfaces. FIGS. 2 and 3 show, in more detail, one of the posts 32 fully inserted into a plated through hole 24 at least extending thereinto, with the tip 50 shown almost touching the far wall of the plated through hole. A row of upper contacts 34 and a row of lower contacts 36 project outwardly from the housing 28 on either side of the ground bus 30 and have solder tails 38 and 40 respectively in contact with their respective contact pads 22, as shown in FIG. 1.

Figure 4:
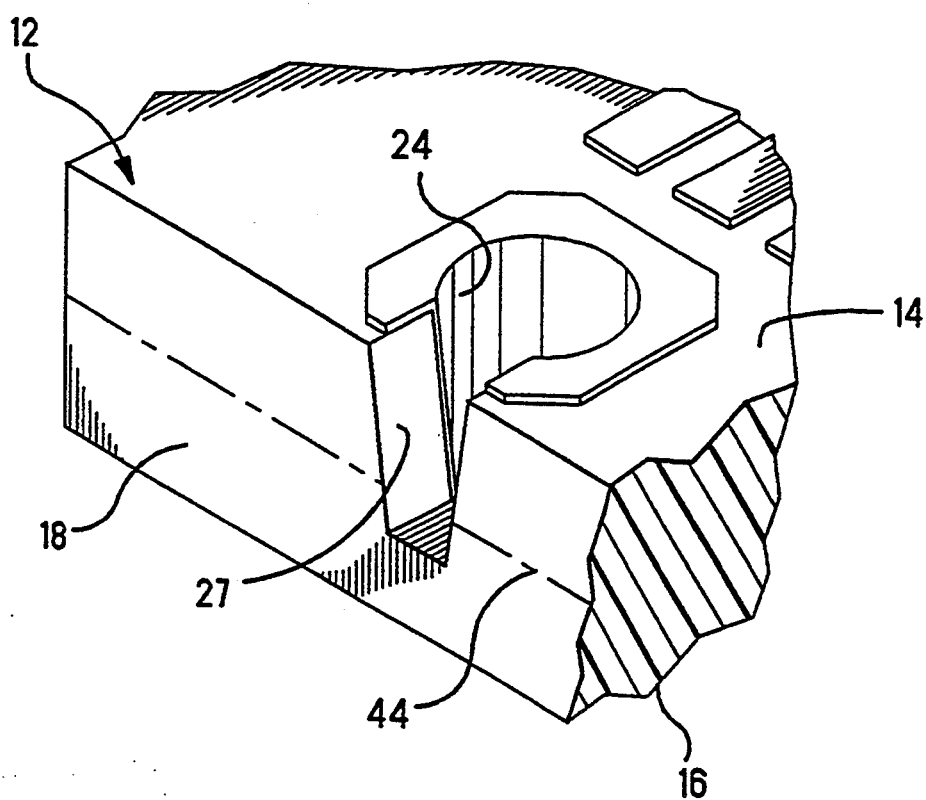
FIG. 4 is an enlarged isometric view of a plated through hole and an opening extending from the edge to the through hole and partially from one major surface toward the other.

In another embodiment of the present invention shown in FIG. 4, an opening 27 is shown provided along card edge 18 extending only partially through board 12, extending from major surface 14 to just beyond medial plane 44, and intersecting the side of through hole 24. Side walls of opening 27 may be chamfered.

FIG. 5 illustrates that the posts 32a, 32b may be angled slightly upwardly and downwardly as they extend through slots 26 and into through holes 24 where they are soldered; the angles may be for example about 15°. The alternatingly angled posts are seen to provide a more effective mechanical joint upon soldering. The posts may also be all angled slightly in a common direction.

The slots 26 are made by means of a shearing tool 60 as shown in FIG. 6. The shearing tool includes a shear blade 62 having a straight back edge 64 that is substantially parallel with the axis of the plated through hole 24 and a front edge 66 that tapers away from the back edge so that the two edges diverge away from the tip 68. The tip 68 is smaller than the inside diameter of the plated through hole 24 and is inserted therein prior to the front shearing edge 66 engaging the wall of the plated hole so that shearing occurs from the inside out. A downwardly facing surface 70 of the shear blade 62 forms a push surface for pushing the sheared slug (not shown) away from the circuit board. A shear block 76 is attached to a base plate 74 by means of screws, not shown. The shear block 76 has a plurality of die openings 78 in alignment with the plated through holes 24, each of which is dimensioned to closely receive a respective shear blade 62 as it is forced downwardly into the associated plated through hole, from its position shown in FIG. 6. As the shear blade 62 moves downwardly, it severs a section of the circuit board and hole plating, pushing it into the die opening 78. As the shear blade 62 continues to move downwardly, the sheared slug is pushed into a clearance opening (not shown) in the base plate 74 beneath die opening 78 where it is discarded. This produces a relatively clean slot with no debris or contamination within the plated through hole. The openings formed by the plated through holes 24 are filled with a suitable solder paste 84, as shown in FIGS. 2, 3 and 5. Additionally, solder paste, not shown, is applied to the contact pads 22 which are to be soldered to the solder tails 38 and 40.

The opposing contacts 38 and 40 are spaced slightly closer together than the thickness of the board but with a lead-in 42 so that when the connector is moved toward the board and into engagement therewith, the lead-in portions of the contacts engage the edges of the board and cam outwardly then slide along the surfaces of the board until they engage their respective contact pads 22. Additionally, as the connector is being moved toward the edge of the board, the posts 32 enter their respective openings 26 and enter and engage the plated through holes 24, displacing a slight amount of solder paste 84 (FIGS. 2, 3 and 5). The slots 26 have a width that is a slight interference fit with the posts 32 so that the friction between the slots and the individual posts firmly holds the connector 10 in place until the soldering operation can be completed. After assembly the unit is then subjected to a heating operation to reflow the solder paste so that each of the posts 32 and solder tails 38, 40 are soldered to their respective plated through holes 24 or solder pads 22.

Preferably, the amount of solder paste injected into through holes 24 is controlled such that the solder paste is recessed below the major surfaces 14,16 so that when the connector 10 is assembled to the circuit board, as set forth above, those solder tails 38 and 40 which pass over the plated through holes 24 will not pick up small amounts of the solder paste contained therein which could otherwise create a trail or bridge of solder paste between two adjacent pads 22 leading to short circuits.

In another embodiment of the present invention, there is shown in FIGS. 7 and 8 one of the plated through holes 24 with an insert 90 in place as an alternative to using solder paste. The insert 90 includes a cylindrically shaped portion 92 having an outside diameter that is a slight interference fit with the inside diameter of the plated through hole 24. The amount of interference is lust sufficient to retain the insert within the hole until after the connector 10 is assembled to the circuit board 12. The cylindrically shaped portion 92 has an elongated opening 94 that is parallel with the axis of the cylinder. The elongated opening 94 is defined by two relatively straight sides 96 and 98 that are turned inwardly and spaced apart a distance that is less than the thickness of a post 32. A pair of opposing Spring members 100 and 102 extend from opposite ends 104 and 106 respectively of the insert 90 diametrically opposite the elongated opening 94. The spring fingers are bent toward each other and toward the elongated opening 94, then each is curved outwardly through the opening 94 and into the slot 26, as shown in FIG. 8. This assures that the elongated opening 94 is in alignment with the slot 26 when the insert 90 is inserted into the plated through hole 24. The two spring fingers 100 and 102 form opposing convex surfaces 108 and 110 respectively which define a constriction and which diverge toward the elongated opening 94 concluding in free ends 112 and 114 respectively which form a lead-in for insertion of the post 32. The convex surfaces 108 and 110 are spaced apart a distance that is less than the thickness of the post 32. A mound 116 of solder is deposited on the inner surface of each spring finger adjacent the convex surfaces 108 and 110 as shown in FIG. 8.

As the post 32 is moved into the slot 26, it wedges between the two convex surfaces 108 and 110 causing them to spread apart slightly. As movement continues the tapered end of the post enters between the edges 96 and 98 causing them to spread apart thereby locking the cylindrical portion 92 against the interior of the plated through hole 24. The two edges 96 and 98 tend to dig into the surfaces of the post slightly thereby gripping it and holding it securely in the slot 26. This effectively holds the entire connector 10 to the circuit board 12 until the soldering operation is complete. When the poet 32 is fully inserted into the slot 26 its tip 50 is preferably at least close to the back inside surface of the cylindrical portion 92, as shown in FIG. 9.

The insert 90 is shown in flat pattern form in FIG. 10. The mounds 116 of solder may be deposited by any thick film printing technique that is well known in the industry. Flux may be added to the solder mounds prior to the solder reflow process. The cylindrically shaped portion 92 is roller from rectangular portion 92' into its cylindrical shape by suitable tooling, not shown, and the edges formed inwardly to define the elongated opening 94. Note that the insert is attached to two carrier strips 118 which are severed prior to forming the spring fingers 100 and 102 into their arcuate shapes and insertion of the completed insert 90 into the plated through holes 24.

An important advantage of the present invention is economically providing accurately positioned openings in the edge of the circuit board extending to the plated through holes spaced from the edge surface, without having to drill or punch holes into the edge surface or risk debris remaining in such holes, thus reducing the cost to manufacture the product and increasing its reliability.

Variations and modifications may be devised to the embodiments disclosed herein, which are within the spirit of the invention and the scope of the claims.

We claim:

1. A circuit board arranged to receive an electrical collector mounted to an edge thereof, said connector at least including contacts having posts adapted to be interconnected to circuitry on said circuit board, said circuit board comprising:

(a) an edge having an edge surface;

(b) two opposite major surfaces extending from said edge surface at least one on which circuitry is defined;

(c) a plurality of plated through holes of selected radius adjacent and spaced inwardly from said edge surface, substantially perpendicular to said major surfaces and in electrical engagement with circuitry on said circuit board, with centers spaced from said edge surface a distance greater than the radius thereof; and (d) a plurality of board openings formed in said edge of said circuit board extending from one of said two major surfaces at least toward the other major surface, wherein each said board opening intersects a respective one of said through holes, with each said board opening having a dimension along the edge surface and parallel to the major surfaces an least less than the diameter of said plated through holes, wherein each of said board openings is adapted to receive a respective one of said pests so than the axis of said one post is generally parallel with and between said two major surfaces and in electrical engagement with its respective plated through hole.

2. The circuit board according to claim 1 wherein said board openings extend from said one major surface at least more than halfway to the other major surface.

3. The circuit board according to claim 2 wherein at least one of said board openings extends from one said major surface to conclude at an end spaced from the other said major surface.

4. The circuit board according to claim 2 wherein said board openings extend completely from said one major surface to the other thereof.

5. The circuit board according to claim 1 including a conductive insert in each of said plurality of plated through holes adapted to physically grip a said post when received in its respective said board opening.

6. The circuit board according to claim 5 wherein each said insert includes a solder mound on a surface thereof arranged so that upon receipt of a said post in said board opening and application of sufficient heat, said solder mound melts and flows to solder said post to its respective plated through hole.

7. The circuit board according to claim 5 wherein each said insert includes a cylindrical shaped portion sized to be an interference fit with its respective plated through holes and having an elongated insert opening in alignment with its respective said board opening, wherein opposed edges of said insert that define said elongated insert opening are spaced apart a distance that is less than the thickness of said post for effecting gripping thereof, and said insert includes a pair of opposing spring members extending from opposite said elongated insert opening and therethrough, and converging to define a constriction and concluding in diverging free ends, said spring members having facing surfaces spaced apart at said constriction to interferingly receive said post when received therebetween.

8. The circuit board according to claim 7 wherein each of said spring members includes a said mound of solder disposed thereon along said facing surfaces and inwardly of said elongated board opening.

9. The combination of an electrical connector and a circuit-board arranged to receive said connector mounted to an edge thereof, said collector at least including one contact post interconnected to circuitry on said circuit board, and said circuit board comprising:

(a) two opposite major surfaces;

(b) at least one plated through hole adjacent said edge, substantially perpendicular to said major surfaces and in electrical engagement with circuitry on said circuit board; and (c) at least one board opening formed in said edge of said circuit board extending from one of said two major surfaces at least toward the other major surface, wherein a said board opening intersects a respective said at least one plated through hole; and each said at least one contact post associated with a respective said plated through hole extends into a respective said board opening so that the axis of said post is generally parallel with and between said two major surfaces and in electrical engagement with its respective plated through hole.

10. The combination according to claim 9 wherein said connector includes a plurality of said posts and said circuit board includes a plurality of said plated through holes and openings associated therewith.

11. The combination according to claim 10 wherein alternating ones of said posts are angled slightly toward one of said two major surfaces of said circuit board, and alternating others of said posts are angled slightly toward the other of said two major surfaces.

12. The combination according to claim 11 wherein at least one of said board openings extends from one said major surface to conclude at an end spaced from the other said major surface.

13. The combination according to claim 9 including a conductive insert into a said plated through hole in interfering engagement with an associated said post so that said post is securely held in place.

14. The combination according to claim 13 wherein said insert includes a cylindrical shaped portion sized to be an interference fit with its respective plated through hole and having an elongated insert opening in alignment with its respective said opening, wherein edges of said insert that define said elongated insert opening are spaced apart a distance that is less than the thickness of said poet for effecting securing thereof.

15. The combination according to claim 14 wherein said insert includes a pair of opposing spring members having free ends extending through said elongated insert opening in resilient interfering engagement with said post, said spring men,pets extend from opposite ends of said insert, diametrically opposite said elongated insert opening, and extend toward said elongated insert opening and toward each other, and then extend along an arcuate path so that each spring member has a convex surface in engagement with opposite sides of said post and said free ends extend through said elongated insert opening.

16. The combination according to claim 9 wherein the center of each said plated through hole is spaced inwardly from said edge surface a distance greater than the radius of said plated through hole, and said board opening has a dimension along the edge surface parallel to the major surfaces less than the diameter of said plated through hole.

17. In a method of mounting an electrical connector to the edge of a circuit board, the steps comprising:

(a) providing a circuit board having circuitry and having an edge having an edge surface, two opposite major surfaces extending from said edge surface, and plated through holes adjacent said edge surface interconnected to said circuitry;

(b) forming a plurality of board openings in said edge so that each said board opening extends from one of said major surfaces at least toward the other said major surface and intersects a respective one of said plated through holes;

(c) providing an edge mountable electrical connector including contacts having posts that extend outwardly spaced to correspond with said board openings;

(d) assembling said connector to said edge of said circuit board by inserting each of said poses into a respective said board opening and into its respective said plated through hole, with the axis thereof generally perpendicular to said edge surface; and (e) providing assured electrical connections between all said posts and respective plated through holes.

18. The method according to claim 17 wherein the step (e) comprises providing solder in the vicinity of each said post and applying sufficient heat to said plated through holes and said posts to cause said solder to melt and flow thereby soldering said posts to their respective plated through holes.

19. The method according to claim 17 including between the steps (c) and (d) the following steps:

(c1) providing a plurality of inserts each having a cylindrical shaped portion that is sized to be an interference fit with one of said plated through holes, said insert having an elongated opening parallel with its longitudinal axis and including a pair of opposing spring member having free ends extending through said elongated insert opening;

(c2) inserting a said insert into at least one of said plated through holes so that said elongated insert opening is in alignment with a respective said board opening;

and wherein step (d) includes :inserting one of said posts into a respective said board opening associated with a respective said through hole containing said insert, and into said elongated insert opening between said pair of spring members so that said post is in interfering engagement with both the edges defining said elongated insert opening and said pair of spring members.

20. The method according to claim 19 wherein step (e) includes providing a mound of solder on at least one of said spring members.

21. The method according to claim 17 wherein step (b) includes inserting a shearing tool into a said plated through hole and causing a shearing action from inside of said hole toward said edge of said circuit board.

22. The method according to claim 17 wherein the step of providing a circuit board includes providing said plated through holes therethrough having centers spaced from said edge surface a distance greater than the radii thereof, and the step of forming said plurality of board openings prorites at least one of said hoard openings having a dimension along the edge surface once parallel to the major surfaces less than the diameters of said plate through holes.

23. The method according to claim 17 wherein the step of forming said plurality of board openings provides at least one of said board openings extending from one said major surface to conclude at an end spaced from the other said major surface.

* * * * *

UNITED STATES PATENT AND TRADEMARK OFFICE
CERTIFICATE OF CORRECTION

PATENT NO. : 5,383,095

DATED : January 17, 1995

INVENTOR(S) : Iosif Korsunsky et al.

It is certified that error appears in the above-identified patent and that said Letters Patent is hereby corrected as shown below:

Column 1, line 46, "imaged" should be --damaged--.
        line 58, "exten-" should be --expen- --.

Column 2, line 60, "plate" should be --plated--.

Column 3, line 30, "holes" should be --slots--.

Column 4, line 64, "lust" should be --just--.
        line 67, after "elongated" insert --insert--.

Column 5, line 34, "poet" should be --post--.
        line 43, "roller" should be --rolled--.

Col. 5,
Claim 1, line 2, "collector" should be --connector--.
        column 6, line 17, "an" should be --at--.
        line 21, "pests" should be --posts--.

Col. 6,
Claim 9, line 3, "collector" should be --connector--.

Col. 7,
Claim 13, line 2, "into" should be --in--.

Claim 14, line 8, "poet" should be --post--.

Claim 15, line 5, "men,pets" should be --members--.

UNITED STATES PATENT AND TRADEMARK OFFICE
CERTIFICATE OF CORRECTION

PATENT NO. : 5,383,095  
DATED : January 17, 1995  
INVENTOR(S) : Iosif Korsunsky et al.

It is certified that error appears in the above-indentified patent and that said Letters Patent is hereby corrected as shown below:

```
Claim 17, column 8, line 13, "poses" should be --posts--.
Col. 8,
Claim 19, line 8, "member" should be --members--.
Col. 8,
Claim 22, line 6, "prorites" should be --provides--.
          line 6, "hoard" should be --board--.
```

Signed and Sealed this

Fourteenth Day of March, 1995

Attest:

BRUCE LEHMAN

*Attesting Officer*       *Commissioner of Patents and Trademarks*